United States Patent
Hieda

(10) Patent No.: US 10,461,481 B2
(45) Date of Patent: Oct. 29, 2019

(54) ELECTRONIC CONTROL UNIT FOR CONTROLLING ROTARY ELECTRIC MACHINE

(71) Applicant: JTEKT CORPORATION, Osaka-shi, Osaka (JP)

(72) Inventor: Takahito Hieda, Kashihara (JP)

(73) Assignee: JTEKT CORPORATION, Osaka-shi (JP)

( * ) Notice: Subject to any disclaimer, the term of this patent is extended or adjusted under 35 U.S.C. 154(b) by 0 days.

(21) Appl. No.: 16/185,615

(22) Filed: Nov. 9, 2018

(65) Prior Publication Data
US 2019/0157819 A1 May 23, 2019

(30) Foreign Application Priority Data
Nov. 17, 2017 (JP) ................................ 2017-221382

(51) Int. Cl.
| | |
|---|---|
| H01R 4/58 | (2006.01) |
| H01R 13/73 | (2006.01) |
| H05K 7/14 | (2006.01) |
| B60R 16/023 | (2006.01) |
| H01R 12/71 | (2011.01) |
| H01R 27/02 | (2006.01) |
| H05K 5/00 | (2006.01) |
| H05K 5/02 | (2006.01) |

(Continued)

(52) U.S. Cl.
CPC ......... *H01R 13/73* (2013.01); *B60R 16/0231* (2013.01); *H01R 12/716* (2013.01); *H01R 27/02* (2013.01); *H05K 5/0017* (2013.01); *H05K 5/0069* (2013.01); *H05K 5/0247* (2013.01); *H05K 7/1432* (2013.01); *H05K 7/20854* (2013.01); *H02M 7/003* (2013.01)

(58) Field of Classification Search
CPC . H01R 12/716; H01R 12/724; H01R 13/5313
USPC .............................................. 439/76.1, 540.1
See application file for complete search history.

(56) References Cited

U.S. PATENT DOCUMENTS

| | | | |
|---|---|---|---|
| 10,170,853 B2 * | 1/2019 | Houvenaghel | ....... H01R 12/724 |
| 10,178,782 B2 * | 1/2019 | Gunes | .................. H05K 5/0069 |

(Continued)

FOREIGN PATENT DOCUMENTS

| | | |
|---|---|---|
| JP | 2013-027203 A | 2/2013 |
| WO | 2017/043219 A1 | 3/2017 |

OTHER PUBLICATIONS

Mar. 20, 2019 Extended European Search Report issued in European Patent Application No. 18206496.4.

*Primary Examiner* — Phuong K Dinh
(74) *Attorney, Agent, or Firm* — Oliff PLC

(57) ABSTRACT

An electronic control unit includes a first circuit board and an electrical connection module disposed on a base of a body housing, a first connector group electrically connected to the electrical connection module, and a second connector group disposed on a wall of the body housing. The first connector group and the second connector group are arranged in a first direction along the wall. The base, the electrical connection module, and the first circuit board have respective positioning holes for positioning relative to each other. A positioning pin is insertable into openings of the second positioning hole and the first positioning hole, and another positioning pin is insertable into openings of the third positioning hole and the first positioning hole.

7 Claims, 5 Drawing Sheets

(51) Int. Cl.
*H05K 7/20* (2006.01)
*H02M 7/00* (2006.01)

(56) References Cited

U.S. PATENT DOCUMENTS

| | | |
|---|---|---|
| 2012/0008286 A1 | 1/2012 | Suzuki |
| 2013/0075886 A1 | 3/2013 | Abe et al. |
| 2013/0235527 A1 | 9/2013 | Wagner et al. |
| 2014/0140119 A1 | 5/2014 | Shinohara et al. |
| 2018/0254620 A1 | 9/2018 | Kosuga |

* cited by examiner

ELECTRONIC CONTROL UNIT FOR CONTROLLING ROTARY ELECTRIC MACHINE

INCORPORATION BY REFERENCE

The disclosure of Japanese Patent Application No. 2017-221382 filed Nov. 17, 2017 including the specification, drawings and abstract, is incorporated herein by reference in its entirety.

BACKGROUND OF THE INVENTION

Field of the Invention

The present invention relates to an electronic control unit.

Description of the Related Art

A power converter including an AC connector and a DC connector is disclosed in, for example, Japanese Patent Application Publication No. 2013-27203 (JP 2013-27203 A). The power converter according to JP 2013-27203 A is mounted on a hybrid automobile. The power converter includes a holding member that holds an AC bus bar, a current sensor module, and a drive circuit board. A positioning pin formed on the holding member is inserted into a through-hole of the current sensor module and a through-hole of the drive circuit board, so that the current sensor module and the drive circuit board are positioned.

Some electronic control units mounted on vehicles include a plurality of connectors and a circuit board. For example, an electronic control unit that controls a rotary electric machine such as a motor includes a connector for electric power and a connector for signals. The plurality of connectors are electrically connected to a circuit board via an electrical connection module including a bus bar. The electrical connection module and the circuit board are arranged and fixed at predetermined positions in the housing of the electronic control unit. To reduce costs, it is desired to simplify the structure for positioning the electrical connection module and the circuit board at predetermined positions. Also, it is desired to allow easy connection of the plurality of connectors of the electronic control unit to the connectors extending from the components of the vehicle, even when the electronic control unit is mounted on the vehicle.

SUMMARY OF THE INVENTION

An object of the present invention is to provide an electronic control unit that allows easy connection of a plurality of connectors, and has a simplified structure for positioning the components.

According to an aspect of the present invention, there is provided an electronic control unit that controls a rotary electric machine, the electronic control unit including: a housing including a wall defining an accommodation space, and a base extending from the wall into the accommodation space; a circuit board disposed on the base in the accommodation space; an electrical connection module disposed at a position different from the circuit board on the base in the accommodation space and electrically connected to the circuit board; a first connector group electrically connected to the electrical connection module; and a second connector group disposed on the wall and electrically connected to the circuit board, wherein: the first connector group and the second connector group are arranged in a first direction along the wall; the base, the electrical connection module, and the circuit board respectively have a first positioning hole, a second positioning hole, and a third positioning hole for positioning relative to each other; a first positioning pin is insertable into an opening of the first positioning hole through the second positioning hole; and a second positioning pin is insertable into another opening of the first positioning hole through the third positioning hole.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

Hereinafter, an electronic control unit according to an embodiment will be described with reference to the drawings. Note that the embodiments described below provide generic or specific examples of the present invention. The numerical values, shapes, materials, elements, the arrangement and connection of the elements, steps, the order of steps, and the like described in the following embodiments are merely examples, and therefore are not intended to limit the scope of the present invention. Further, among the elements described in the following embodiments, elements not recited in the independent claim with the broadest scope are described as optional elements. Further, in the following description of the embodiments, there are expressions using the word "substantially", such as "substantially parallel" and "substantially orthogonal". For example, "substantially parallel" includes both the meaning of "exactly parallel" and the meaning of "approximately parallel". That is, the expression "substantially parallel" indicates that a deviation of, for example, about a few to a dozen percentage points is allowed. The same applies to other expressions using the word "substantially". Furthermore, the drawings are schematic only and not necessarily to scale. The like elements are denoted by like numerals throughout the drawings, and a description thereof will not be repeated or will be made briefly.

The configuration of an electronic control unit 100 according to an embodiment will be described. In the present embodiment, the electronic control unit 100 is mounted on a vehicle, and controls a rotary electric machine. The rotary electric machine may be a motor that converts electric energy into mechanical rotational energy, an electric generator that converts mechanical rotational energy into electric energy, or a device that serves as both a motor and an electric generator. The rotary electric machine may include one or more rotors. The electronic control unit 100 includes connectors that serve as connecting parts for establishing electrical connections to the rotary electric machine and various other devices such as a sensor. The connectors include a power connector for transmitting and receiving electric power and a signal connector for transmitting and receiving signals. The electronic control unit 100 may be mounted on any object other than a vehicle. The device controlled by the electronic control unit 100 may be any device other than a rotary electric machine.

Figure 1:
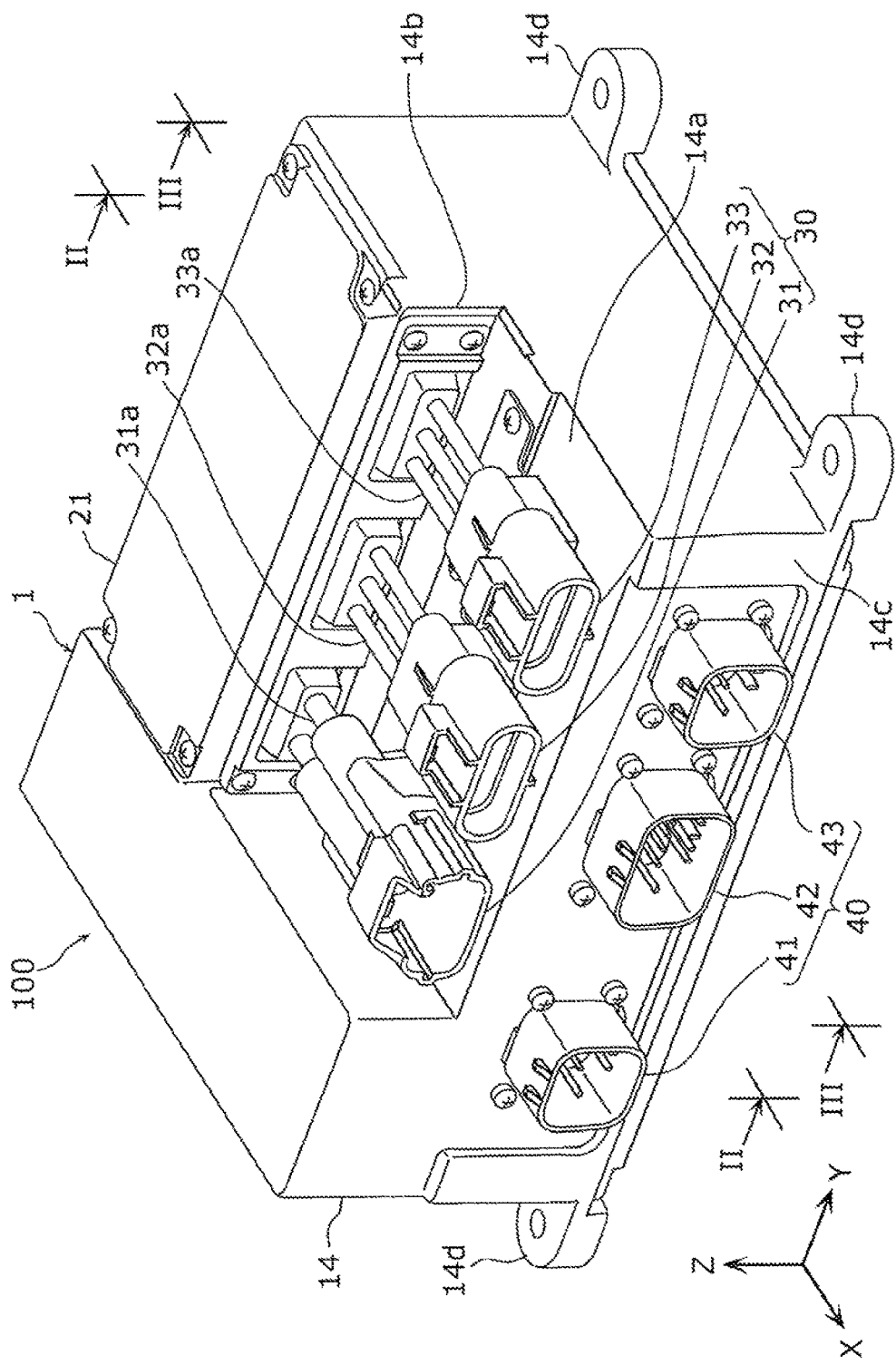
FIG. 1 is a schematic diagram illustrating the external appearance of an electronic control unit according to an embodiment.
Figure 2:
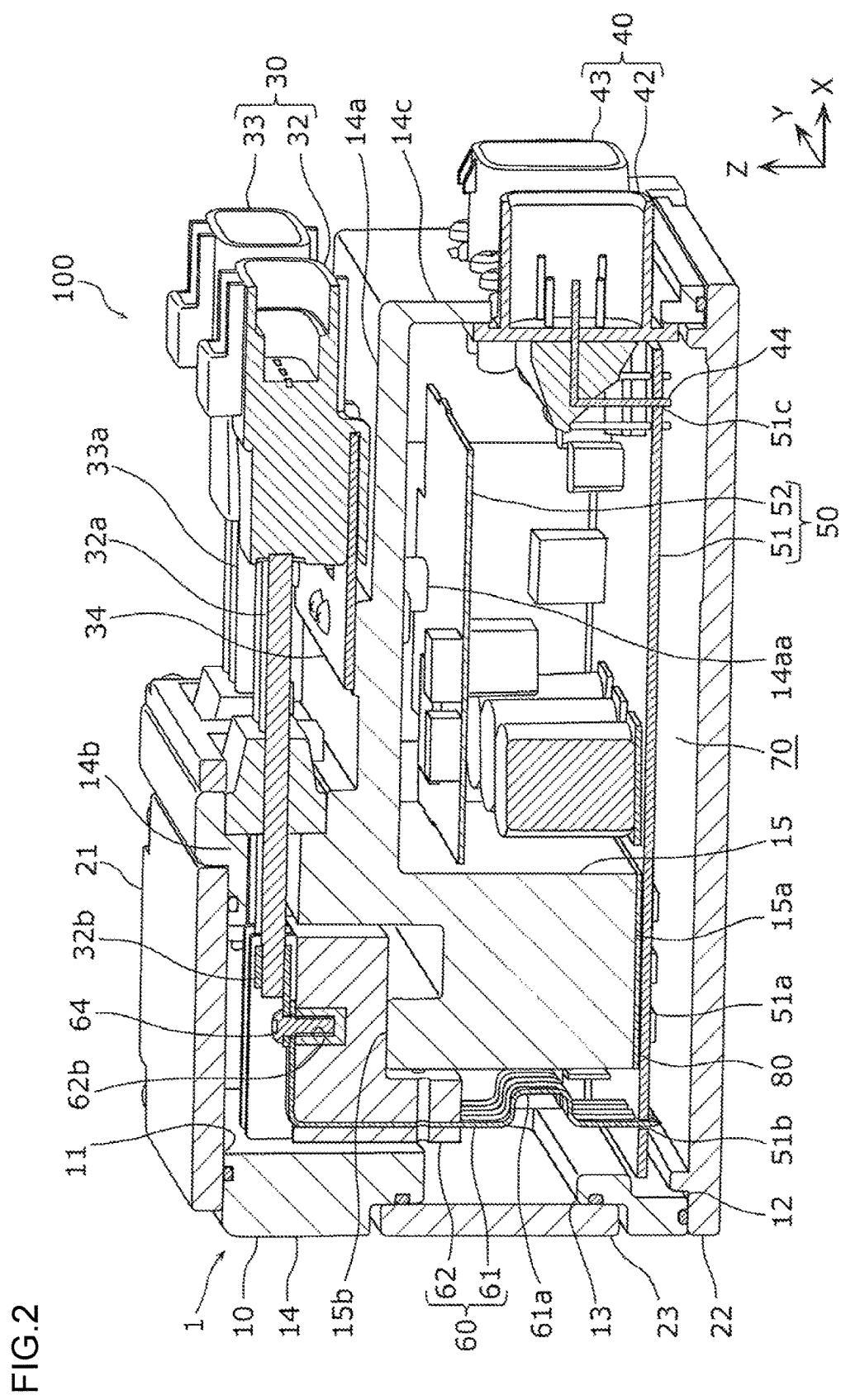
FIG. 2 is a schematic cross-sectional side view illustrating a cross section of the electronic control unit of FIG. 1 parallel to an XZ plane and passing through a second power connector and a second signal connector as viewed in a direction II along a Y-axis.

FIGS. 1 and 2 illustrate the electronic control unit 100 according to the present embodiment. Specifically, FIG. 1 is a schematic diagram illustrating the external appearance of the electronic control unit 100 according to the present embodiment. FIG. 2 is a schematic cross-sectional side view illustrating a cross section of the electronic control unit 100 of FIG. 1 parallel to an XZ plane and passing through a second power connector 32 and a second signal connector 42 as viewed in a direction II along a Y-axis.

As illustrated in FIGS. 1 and 2, the electronic control unit 100 includes a housing 1, a first connector group 30, a second connector group 40, a circuit board 50 disposed in the housing 1, and an electrical connection module 60 disposed in the housing 1. In the present embodiment, the housing 1 has the outer shape of a rectangular solid with a part cut off. However, the present invention is not limited thereto, and the housing 1 may have any outer shape. The housing 1 includes a body housing 10, a first cover housing 21, a second cover housing 22, and a third cover housing 23. The first cover housing 21 covers a first opening 11 of the body housing 10. The second cover housing 22 covers a second opening 12 of the body housing 10. The third cover housing 23 covers a third opening 13 of the body housing 10.

The body housing 10 is made of an electrically and thermally conductive material having strength, and preferably has heat resistance. Examples of the material of the body housing 10 include metals such as aluminum and aluminum alloy. The first cover housing 21, the second cover housing 22, and the third cover housing 23 are made of a material having strength, and preferably have heat resistance. The first cover housing 21, the second cover housing 22, and the third cover housing 23 may be made of the same material as that of the body housing 10, or may be made of a different material from that of the body housing 10, which may be, for example, metal such as stainless steel, resin, or ceramics.

The body housing 10 includes a wall 14 defining an accommodation space 70 on the inner side thereof, and a base 15 extending from the wall 14 into the accommodation space 70. The wall 14 and the base 15 are made of the same material and are formed as an integral unit. The base 15 extends to project from the wall 14 into the accommodation space 70, and is made of a metal block greatly thicker than the wall 14. In the present embodiment, the base 15 has the outer shape of a rectangular solid. However, the present invention is not limited thereto, and the base 15 may have any outer shape. The base 15 is made of a solid pure metal block to increase the volume for storing heat. The base 15 is thermally conductive and capable of dissipating the transferred heat while temporarily storing the heat. That is, the base 15 can serve as a heatsink. Note that the base 15 may be hollow.

The wall 14 has the second opening 12 open in a first direction, and the first opening 11 open in the direction opposite to the first direction, that is, the direction opposite to the second opening 12. The wall 14 further includes the third opening 13 open on the lateral side of the first opening 11 and the second opening 12, specifically in the direction substantially perpendicular to the first direction. The first opening 11 is smaller than the second opening 12, and faces a part of the second opening 12. The first cover housing 21, the second cover housing 22, and the third cover housing 23 respectively covering the first opening 11, the second opening 12, and the third opening 13 define, together with the wall 14, the accommodation space 70 on their inner side.

Here, the first direction is defined as a Z-axis negative direction, and the direction opposite to the first direction is defined as a Z-axis positive direction. For example, the Z-axis negative direction is the direction from the first opening 11 toward the second opening 12. The opening direction of the third opening 13 from the inner side to the outer side of the wall 14 and parallel to the Z axis is defined as an X-axis negative direction, and its opposite direction is defined as an X-axis positive direction. One of the directions perpendicular to the X-axis positive direction and the Z-axis positive direction is defined as a Y-axis positive direction, and its opposite direction is defined as a Y-axis negative direction. The Y-axis positive direction is, for example, the direction toward the depth direction in FIG. 2. The first opening 11 and the second opening 12 have open ends along an XY plane, and the third opening 13 has an open end along a YZ plane.

The wall 14 includes, as an integral part, a first wall 14a facing the second opening 12, at a position closer to the second opening 12 than to the first opening 11 in the Z-axis negative direction. The first wall 14a extends along the second opening 12, specifically along the XY plane. The first wall 14a is disposed adjacent to the first opening 11 in the X-axis positive direction. The first wall 14a defines a step recessed in the Z-axis negative direction with respect to the first cover housing 21.

The wall 14 includes, as integral parts, a second wall 14b extending between the first opening 11 and the first wall 14a, and a third wall 14c extending between the first wall 14a and the second opening 12. The second wall 14b is located on the side of the first wall 14a opposite to the third wall 14c. Specifically, the second wall 14b is located at one end of the first wall 14a in the X-axis negative direction, and the third wall 14c is located at the other end of the first wall 14a in the X-axis positive direction. The second wall 14b and the third wall 14c define the side walls of the body housing 10, face the same direction, specifically the X-axis positive direction, and extend along the YZ plane.

The wall 14 includes, as integral parts, a plurality of mounting legs 14d near the second opening 12. In the present embodiment, the wall 14 includes four mounting legs 14d. The mounting legs 14d are portions for mounting and fixing the electronic control unit 100 to mounted portions of the vehicle (not illustrated). The mounting legs 14d are fixed to the mounted portions by fastening members such as screws. The shape, position, and the number of mounting legs 14d may be changed in accordance with the structure of the mounted portions.

The circuit board 50 includes a first circuit board 51 and a second circuit board 52. The first circuit board 51 is disposed on the base 15 in the accommodation space 70. The first circuit board 51 and the second circuit board 52 include various electronic parts and interconnects. In the present embodiment, the first circuit board 51 and the second circuit board 52 are printed boards.

The first circuit board 51 is disposed on a first flat surface 15a of the base 15. The first flat surface 15a faces the second opening 12, and faces the Z-axis negative direction. The first flat surface 15a is a surface substantially parallel to the XY plane, although the present invention is not limited thereto. The first circuit board 51 is disposed in contact with the first flat surface 15a, and is fixed to the wall 14 and the base 15 by screws or the like. The first circuit board 51 disposed on the first flat surface 15a extends along the open end of the second opening 12, specifically along the XY plane. When the second cover housing 22 is not placed, the entire first circuit board 51 is exposed through the second opening 12. Accordingly, the first circuit board 51 may be placed in the accommodation space 70 through the second opening 12.

A sheet-shaped insulating member 80 is disposed between the first flat surface 15a of the base 15 having an electrical conductivity and the first circuit board 51. The insulating member 80 is made of an electrically insulative and thermally conductive material. Examples of the material of the insulating member 80 include silicone. The insulating member 80 is disposed to cover the entire first flat surface 15a. The insulating member 80 electrically insulates the base 15 and the first circuit board 51, and transfers heat of the first circuit board 51 to the base 15.

The second circuit board 52 is disposed on a mount 14aa projecting from the first wall 14a into the accommodation space 70, and fixed to the mount 14aa by screws or the like. The second circuit board 52 is disposed between and spaced apart from the first wall 14a and the first circuit board 51.

The first circuit board 51 and the second circuit board 52 include various circuits such as a control circuit, an inverter circuit, and a 24 V (volt) compatible circuit for the rotary electric machine. An inverter circuit 51a that generates a large amount of heat is disposed adjacent to the base 15 and the insulating member 80 in the Z-axis negative direction. In other words, the inverter circuit 51a is disposed at a position on the first circuit board 51 facing the base 15 and the insulating member 80 in the Z-axis negative direction, on the surface of the first circuit board 51 on a side opposite to the base 15. The base 15 is disposed adjacent to the inverter circuit 51a, which is a heat generating part of the first circuit board 51. Accordingly, heat generated by the inverter circuit 51a is efficiently transferred to the base 15, thereby preventing overheating of the first circuit board 51. The inverter circuit 51a is an example of a heat generating part of a circuit board.

The first connector group 30 includes at least one connector. Specifically, the first connector group 30 includes a first power connector 31, the second power connector 32, and a third power connector 33. The second connector group 40 includes at least one connector. Specifically, the second connector group 40 includes a first signal connector 41, the second signal connector 42, and a third signal connector 43. The first connector group 30 and the second connector group 40 may include any number of connectors. The power connectors 31, 32, and 33 are examples of first connectors, and the signal connectors 41, 42, and 43 are examples of second connectors.

The power connectors 31, 32, and 33 are configured to be connected to a harness (also referred to as a "cable") extending from a power supply source, a rotary electric machine, and so on of the vehicle (not illustrated). Examples of power supply sources include a secondary battery and an inverter device. The power connectors 31, 32, and 33 mediate transmission and reception of electric power between the electronic control unit 100 and the power source supply, the rotary electric machine, and so on. A high current with a relatively high current value flows through the power connectors 31, 32, and 33.

The signal connectors 41, 42, and 43 are configured to be connected to connectors of a harness extending from sensors, other electronic control units, and so on mounted on the vehicle (not illustrated). The signal connectors 41, 42, and 43 mediate transmission and reception of signals between the electronic control unit 100 and the sensors, other electronic control units, and so on. A low current flows through the signal connectors 41, 42, and 43. The low current has a lower current value than the current flowing through the power connectors 31, 32, and 33.

The power connectors 31, 32, and 33 are disposed outside the body housing 10. Specifically, the power connectors 31, 32, and 33 are disposed on the first wall 14a, and fixed to the first wall 14a via a bracket 34 by screws or the like. The signal connectors 41, 42, and 43 are disposed on the third wall 14c, and fixed to the third wall 14c by screws or the like. Specifically, the signal connectors 41, 42, and 43 are disposed to extend through three through-holes formed in the third wall 14c such that their connecting parts project outward from the third wall 14c.

The first connector group 30 and the second connector group 40 are arranged in the first direction along the wall 14. Specifically, the first connector group 30 and the second connector group 40 are arranged in the Z-axis negative direction along the third wall 14c. That is, the first connector group 30 and the second connector group 40 are arranged in two stages in the Z-axis direction. Further, the power connectors 31, 32, and 33, and the signal connectors 41, 42, and 43 are arranged such that their connecting parts to be connected to other connectors, that is, their distal ends face a second direction crossing the first direction. Accordingly, the first connector group 30 and the second connector group 40 are oriented in the same direction. In the present embodiment, the second direction is the X-axis positive direction. However, the present invention is not limited thereto.

The signal connectors 41, 42, and 43 include second connecting members 44 extending from the signal connectors 41, 42, and 43 to the first circuit board 51, respectively. The second connecting members 44 are made of electrically conductive metal. The second connecting members 44 may be, for example, bus bars. The second connecting member 44 of each of the signal connectors 41, 42, and 43 extends to the first circuit board 51. Specifically, the second connecting member 44 extends through a second connecting through-hole 51c in the first circuit board 51 so as to be electrically connected to the first circuit board 51. Accordingly, each of the signal connectors 41, 42, and 43 is electrically connected to the first circuit board 51. The second connecting through-hole 51c, that is, the connecting portion between the second connecting member 44 and the first circuit board 51 is located near a corresponding one of the signal connectors 41, 42, and 43 and the third wall 14c. The second connecting through-hole 51c is located in the X-axis positive direction with respect to the base 15. The second connecting member 44 may be fixed to the first circuit board 51, in the second connecting through-hole 51c, by soldering or the like.

The power connectors 31, 32, and 33 include cables 31a, 32a, and 33a extending from the power connectors 31, 32, and 33 to the second wall 14b, respectively. The cables 31a, 32a, and 33a extend though the second wall 14b so as to be connected to the electrical connection module 60 disposed in the accommodation space 70.

The electrical connection module 60 includes at least one first connecting member 61, and a support member 62 that supports the first connecting member 61. The first connecting member 61 is made of electrically conductive metal. The first connecting member 61 may be, for example, a bus bar. The support member 62 is made of an electrically insulative material. Examples of the material of the support member 62 include resin and insulative ceramics. In the present embodiment, the support member 62 is made of resin. In this case, the support member 62 and the first connecting member 61 may be molded as an integral unit by insert molding or the like. That is, the electrical connection module 60 may have a resin mold structure. In this case, as illustrated in FIG. 2, the first connecting member 61 may extend through the support member 62 so as to be integral with the support member 62.

Figure 3:
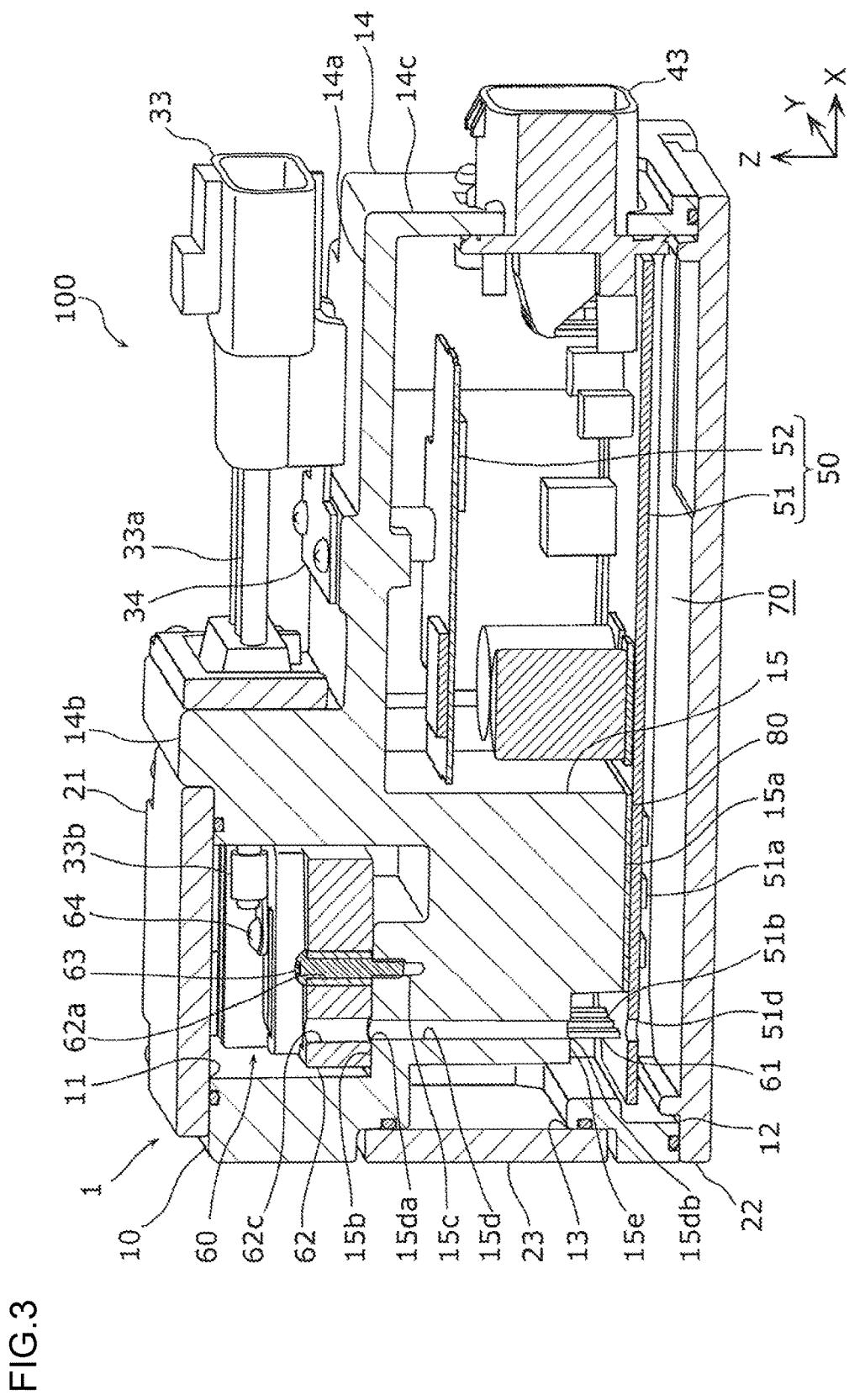
FIG. 3 is a schematic cross-sectional side view illustrating a cross section of the electronic control unit of FIG. 1 parallel to an XZ plane and passing through a third power connector and a third signal connector as viewed in a direction III along a Y-axis.
Figure 4:
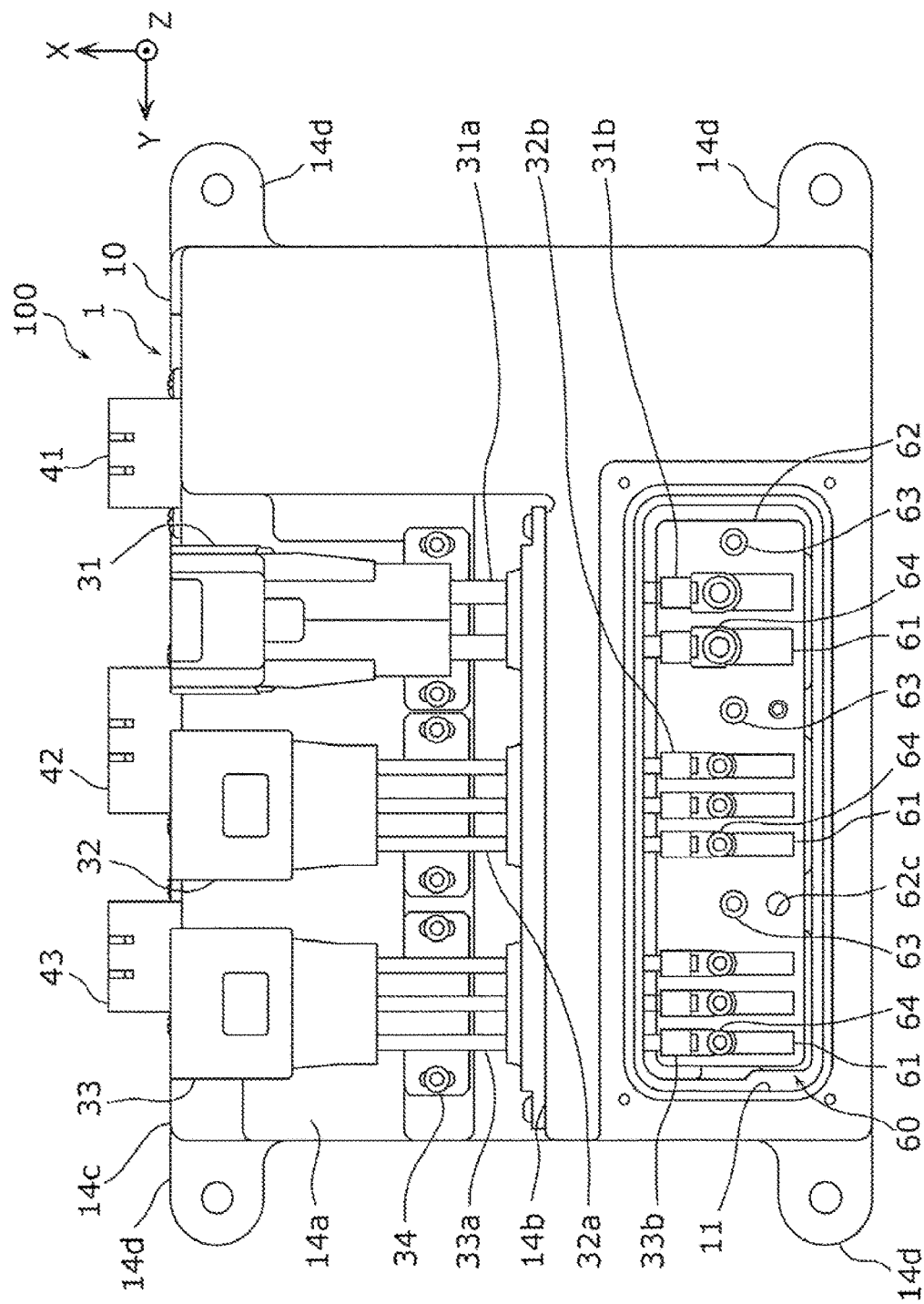
FIG. 4 is a schematic plan view of the electronic control unit of FIG. 1 with a first cover housing removed to expose a first opening of a body housing.

The electrical connection module 60 is disposed at a position different from the first circuit board 51 on the base 15 in the accommodation space 70. Specifically, the support member 62 of the electrical connection module 60 is disposed on a second flat surface 15b of the base 15 located on the side opposite to the first flat surface 15a in the Z-axis direction, and is fixed by a screw or the like. The second flat surface 15b faces the first opening 11, and faces the Z-axis positive direction. The second flat surface 15b is a surface substantially parallel to the XY plane, although the present invention is not limited thereto. In the present embodiment, as illustrated in FIG. 3, a screw 63 extends through a screw through-hole 62a in the support member 62, and is threaded into an internally threaded hole 15c in the second flat surface 15b of the base 15. Thus, the support member 62 is fixed to the base 15. Alternatively, as illustrated in FIG. 4, a plurality of screw through-holes 62a and a plurality of internally threaded holes 15c may be provided for threaded engagement with a plurality of screws 63. Note that FIG. 3 is a schematic cross-sectional side view illustrating a cross section of the electronic control unit 100 of FIG. 1 parallel to the XZ plane and passing through the third power connector 33 and the third signal connector 43 as viewed in a direction III along the Y-axis. FIG. 4 is a schematic plan view of the electronic control unit 100 of FIG. 1 with the first cover housing 21 removed to expose the first opening 11 of the body housing 10.

Each first connecting member 61 extends from the support member 62 to the first circuit board 51. Each first connecting member 61 is connected at one end to a corresponding one of the cables 31a, 32a, and 33a, and is connected at the other end to the first circuit board 51. Each first connecting member 61 extends in the X-axis negative direction on the support member 62 from the one end, then turns to extend through the support member 62 in the Z-axis negative direction, and then extends through a first connecting through-hole 51b in the first circuit board 51 at the other end. Thus, each first connecting member 61 is electrically connected to the first circuit board 51. The first connecting member 61 may be fixed at the other end to the first circuit board 51 by soldering or the like. The first connecting through-hole 51b, that is, the connecting portion between the first connecting member 61 and the first circuit board 51 is located near the third opening 13. The first connecting through-hole 51b is located in the X-axis negative direction with respect to the base 15, and on the side opposite to the second connecting through-hole 51c. Accordingly, the first connecting member 61 and the second connecting member 44 are connected to the first circuit board 51, on the opposite sides with respect to the base 15.

Each first connecting member 61 has a bent portion 61a bent in a U-shape toward the lateral side between the support member 62 and the first circuit board 51. In the present embodiment, the bent portion 61a is bent to project in the X-axis positive direction. However, the bent portion 61a may project in any direction that crosses the Z-axis direction in which the first connecting member 61 extends. That is, each first connecting member 61 only needs to have an extra length between the support member 62 and the first circuit board 51. For example, when the electronic control unit 100 vibrates, the first circuit board 51 may be deformed and displaced with respect to the first connecting member 61. Further, the first connecting member 61, the support member 62, and the first circuit board 51 may expand and contract due to changes in ambient temperature. In such cases, the first connecting member 61 is deformed at the bent portion 61a to absorb stress generated in the first connecting member 61. This reduces the load on the connecting portion between the first connecting member 61 and the first circuit board 51, thereby maintaining a reliable connection.

As illustrated in FIGS. 2 and 4, the power connectors 31, 32, and 33 are connected to two or three cables 31a, two or three cables 32a, and two or three cables 33a, respectively. The first connecting members 61 are provided one for each of the cables 31a, 32a, and 33a. Terminals 31b, 32b, and 33b at the ends of the respective cables 31a, 32a, and 33a are connected to the corresponding first connecting members 61 in the accommodation space 70. Specifically, a screw 64 extends through a through-hole of one of the terminals 31b, 32b, and 33b, and a through-hole of one of the first connecting members 61, and is threaded into an internally threaded hole 62b of the support member 62. Thus, the terminals 31b, 32b, and 33b are physically and electrically connected to the corresponding first connecting members 61. Accordingly, the power connectors 31, 32, and 33 are connected to the electrical connection module 60 via the cables 31a, 32a, and 33a, and are further connected to the first circuit board 51 via the first connecting members 61, respectively.

The power connectors 31, 32, and 33 are removably attached to the electrical connection module 60. Therefore, the electrical connection module 60 can be electrically connected to a harness having connectors of various shapes by changing the power connectors 31, 32, and 33. In the present embodiment, the two cables 31a of the first power connector 31 have an equal length; the three cables 32a of the second power connector 32 have an equal length; and the three cables 33a of the third power connector 33 have an equal length. Further, the cables 32a and 33a have an equal length. However, all the cables 31a, 32a, and 33a may have an equal length. The word "equal" includes both the meaning of "the same" and the meaning of "substantially the same". The expression "substantially the same" indicates that a deviation of, for example, about a few to a dozen percentage points is allowed. Such a comparison may be made in percentage, or may be made in actual length, depending on the size of the object to compare, for example.

The first wall 14a of the body housing 10 is disposed between the cables 31a, 32a, and 33a extending from the second wall 14b and all the power connectors 31, 32, and 33, and the circuit board 50. The first wall 14a having an electrical conductivity serves as a shield to separate all the cables 31a, 32a, and 33a and the power connectors 31, 32, and 33 from the circuit board 50. The first wall 14a shields the circuit board 50 from noise due to the current flowing through the cables 31a, 32a, and 33a and the power connectors 31, 32, and 33.

As illustrated in FIG. 4, the support member 62, and the connecting portions between the terminals 31b, 32b, and 33b and the first connecting members 61 are exposed through the first opening 11 when the first cover housing 21 is not placed. Accordingly, the terminals 31b, 32b, and 33b are easily attached to and removed from the first connecting members 61.

Referring to FIG. 3, the base 15 has a first positioning hole 15d. The first positioning hole 15d extends through the base 15 from the support member 62 toward the first circuit board 51. Specifically, the first positioning hole 15d extends from the second flat surface 15b toward the first circuit board 51. The first positioning hole 15d is a straight linear hole extending substantially parallel to the Z-axis, although the present invention is not limited thereto. One end of the first positioning hole 15d is open in an opening 15da of the second flat surface 15b. The opening 15da faces the first opening 11. The other end of the first positioning hole 15d is open in an opening 15db of a surface 15e of the base 15 located on the side opposite to the opening 15da in the Z-axis direction. The opening 15db faces the second opening 12. The first positioning hole 15d is a hole continuously extending from the opening 15da to the opening 15db. In the present embodiment, the bore diameter of the first positioning hole 15d is constant. However, the present invention is not limited thereto.

The support member 62 of the electrical connection module 60 has a second positioning hole 62c extending through the support member 62. The first circuit board 51 has a third positioning hole 51d extending through the first circuit board 51. The second positioning hole 62c and the third positioning hole 51d extend in the same direction as the first positioning hole 15d. The bore diameter of the second positioning hole 62c is equal to the bore diameter of the opening 15da of the first positioning hole 15d. The bore diameter of the third positioning hole 51d is equal to the bore diameter of the opening 15db of the first positioning hole 15d.

Figure 5:
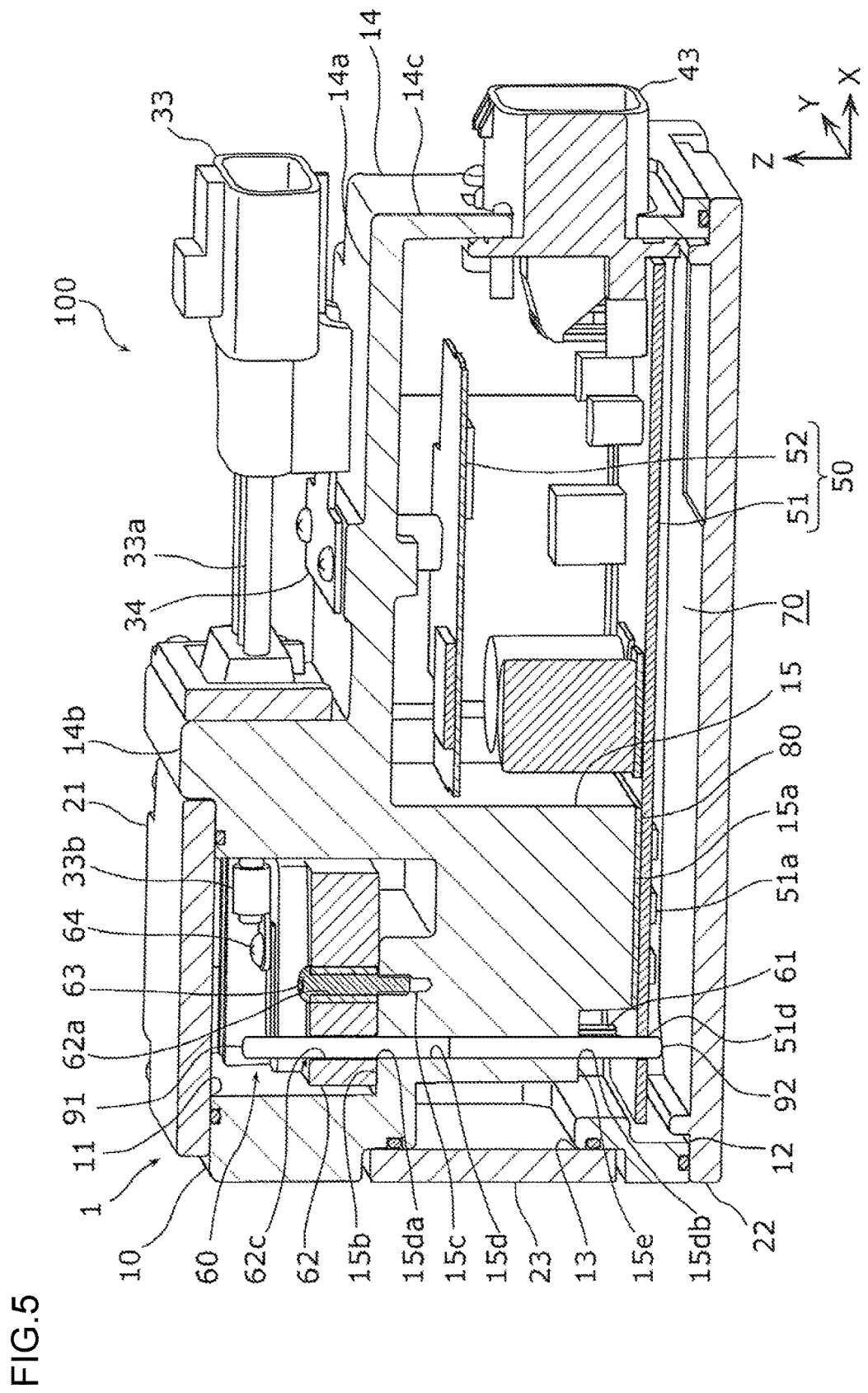
FIG. 5 is a schematic cross-sectional side view of the electronic control unit of FIG. 3 with positioning pins inserted in positioning through-holes.

When the electrical connection module 60 is positioned at a predetermined position with respect to the base 15, the second positioning hole 62c is aligned with the opening 15da of the first positioning hole 15d, and the axis of the second positioning hole 62c coincides with the axis of the first positioning hole 15d. Accordingly, the second positioning hole 62c and the first positioning hole 15d define a single straight linear hole. Thus, as illustrated in FIG. 5, a first positioning pin 91 can be inserted into the opening 15da of the first positioning hole 15d through the second positioning hole 62c. Note that FIG. 5 is a schematic cross-sectional side view illustrating the electronic control unit 100 of FIG. 3 with the positioning pins 91 and 92 inserted in the respective positioning through-holes.

As illustrated in FIG. 3, when the first circuit board 51 is positioned at a predetermined position with respect to the base 15, the position of the third positioning hole 51d is aligned with the position of the opening 15db of the first positioning hole 15d, and the axis of the third positioning hole 51d coincides with the axis of the first positioning hole 15d. Accordingly, the third positioning hole 51d and the first positioning hole 15d are aligned in the Z-axis direction to define a single straight linear hole. Thus, as illustrated in FIG. 5, a second positioning pin 92 can be inserted into the opening 15db of the first positioning hole 15d through the third positioning hole 51d.

In this manner, the positioning pins 91 and 92 are used when assembling the electronic control unit 100. This facilitates positioning of the electrical connection module 60 and the first circuit board 51 with respect to the base 15.

Specifically, when mounting the electrical connection module 60 to the base 15, for example, the first positioning pin 91 is first inserted from the opening 15da into the first positioning hole 15d of the base 15. Then, the electrical connection module 60 is placed on the second flat surface 15b of the base 15 while the first positioning pin 91 extending in the Z-axis positive direction is inserted into the second positioning hole 62c of the electrical connection module 60 from the base 15, through the first opening 11 of the body housing 10. Then, the electrical connection module 60 is rotated about the first positioning pin 91, so that the screw through-holes 62a of the support member 62 is aligned with the corresponding internally threaded holes 15c of the base 15. Then, the screws 63 are inserted into the corresponding screw through-holes 62a, and are threaded into the corresponding internally threaded holes 15c. In this manner, the electrical connection module 60 is fixed to a predetermined position with respect to the base 15. Note that the first positioning pin 91 projects outward in the Z-axis positive direction from the second positioning hole 62c. Therefore, after the electrical connection module 60 is fixed, the first positioning pin 91 is pulled out of the second positioning hole 62c and removed.

Further, when mounting the first circuit board 51 to the base 15, for example, the second positioning pin 92 is first inserted from the opening 15db into the first positioning hole 15d of the base 15. Then, the first circuit board 51 is placed on the first flat surface 15a of the base 15, while the second positioning pin 92 extending from the base 15 in the Z-axis negative direction is inserted into the third positioning hole 51d of the first circuit board 51, through the second opening 12 of the body housing 10. The insulating member 80 may be attached to the first flat surface 15a in advance. Then, the first circuit board 51 is rotated about the second positioning pin 92. Thus, the connecting through-holes 51b and 51c of the first circuit board 51 are aligned with the first connecting members 61 and the second connecting members 44. Then, the first connecting members 61 and the second connecting members 44 are inserted into the corresponding connecting through-holes 51b and 51c. In this step, the insertion is facilitated by adjusting the positions of the first connecting members 61 and the second connecting members 44, through the third opening 13. With the alignment described above, a screw through-hole (not illustrated) of the first circuit board 51 and an internally threaded hole (not illustrated) of the body housing 10 are also aligned. Then, the first circuit board 51 is fixed to the body housing 10 by screwing into the screw through-hole and the internally threaded hole. In this manner, the first circuit board 51 is fixed to a predetermined position with respect to the base 15. Note that the second positioning pin 92 projects outward in the Z-axis negative direction from the third positioning hole 51d. Therefore, after the first circuit board 51 is fixed, the second positioning pin 92 is pulled out of the third positioning hole 51d and removed. Also, after the first circuit board 51 is fixed, the first connecting members 61 and the second connecting members 44 are soldered to the first circuit board 51.

Note that the method of mounting the electrical connection module 60 and the first circuit board 51 to the base 15 is not limited to the method described above. For example, the electrical connection module 60 may be mounted on the base 15, with the first positioning pin 91 inserted in the second positioning hole 62c. Also, the first circuit board 51 may be mounted on the base 15, with the second positioning pin 92 inserted in the third positioning hole 51d. Alternatively, a single positioning pin may be used instead of using the first positioning pin 91 and the second positioning pin 92. In this case, the positioning pin may have such a length that both ends project out of the first positioning hole 15d when inserted in the first positioning hole 15d. Thus, the electrical connection module 60 and the first circuit board 51 can be positioned using the single positioning pin inserted in the first positioning hole 15d.

As described above, in the electronic control unit 100 according to the present embodiment, the first connector group 30 and the second connector group 40 are arranged in the first direction along the wall 14. Further, the base 15 of the body housing 10, the electrical connection module 60, and the first circuit board 51 respectively have the first positioning hole 15d, the second positioning hole 62c, and the third positioning hole 51d for positioning relative to each other. The first positioning pin 91 can be inserted into the opening 15da of the first positioning hole 15d through the second positioning hole 62c. The second positioning pin 92 can be inserted into the other opening 15db of the first positioning hole 15d through the third positioning hole 51d.

With the above configuration, when the first positioning pin 91 is inserted into the second positioning hole 62c and the first positioning hole 15d, the electrical connection module 60 is positioned with respect to the base 15. Also, when the second positioning pin 92 is inserted into the third positioning hole 51d and the first positioning hole 15d, the first circuit board 51 is positioned with respect to the base 15. The positioning of the electrical connection module 60 and the positioning of the first circuit board 51 are performed in the different openings 15da and 15db of the first positioning hole 15d, that is, the positionings thereof are performed at different positions, and therefore mutual influence is reduced. This facilitates their positioning. The first positioning hole 15d is used for positioning the electrical connection module 60 and the first circuit board 51. Accordingly, the number of holes for positioning is reduced, which reduces the man-hours required to form such holes. Further, since the first connector group 30 and the second connector group 40 are arranged in the first direction along the wall 14, the first connector group 30 and the second connector group 40 can be accessed from the same direction. This allows easy connection of connectors in the first connector group 30 and the second connector group 40, and can reduce the space required for connection. With this configuration, the electronic control unit 100 allows easy connection of connectors, and has a simplified positioning structure.

Further, for example, in the case where the first positioning hole 15d is a straight through-hole, the first positioning hole 15d can be more easily formed, and the structure of the first positioning hole 15d is further simplified. Furthermore, since the openings 15da and 15db are provided on the opposite sides of the first positioning hole 15d, the mutual influence between the positioning of the electrical connection module 60 and the positioning of the first circuit board 51 is more effectively reduced, and their positioning is facilitated.

In the electronic control unit 100 according to the present embodiment, the first connector group 30 is disposed outside the body housing 10, and is connected to the electrical connection module 60 via the cables 31a, 32a, and 33a. The electrically conductive first wall 14a of the body housing 10 serves as a shield to separate the first connector group 30 and the cables 31a, 32a, and 33a from the circuit board 50. With the above configuration, the first wall 14a blocks the noise due to the current flowing through the first connector group 30 and the cables 31a, 32a, and 33a to reduce the effect of the noise on the electronic parts of the circuit board 50.

In the electronic control unit 100 according to the present embodiment, the cables 32a and 33a of the first connector group 30 have an equal length. With this configuration, the cables 32a and 33a can have equal impedance. This can reduce variation in the current flowing from the first connector group 30 to a device to which the first connector group 30 is connected. Thus, in the case where the first connector group 30 is connected to the rotary electric machine as in the present embodiment, the rotary electric machine can operate stably.

In the electronic control unit 100 according to the present embodiment, the first connecting member 61 of the electrical connection module 60 and the second connecting member 44 of the second connector group 40 are connected to the first circuit board 51, on the opposite sides with respect to the base 15. With this configuration, the electrical connection module 60, that is, a circuit associated with the first connector group 30, and a circuit associated with the second connector group 40 can be disposed apart from each other on the first circuit board 51. This prevents one of the circuits from interference due to noise of the other circuit. In particular, in the present embodiment, the circuit associated with the first connector group 30 is a power system circuit, and the circuit associated with the second connector group 40 is a signal processing circuit. Accordingly, the circuit associated with the second connector group 40 is less affected by the circuit associated with the first connector group 30. In the present embodiment, the base 15 is made of electrically conductive metal. Accordingly, the base 15 can also serve as a shield.

In the electronic control unit 100 according to the present embodiment, at least one of the power connectors 31, 32, and 33 of the first connector group 30 and at least one of the signal connectors 41, 42, and 43 of the second connector group 40 are arranged such that their connecting parts face the second direction crossing the first direction. In the present embodiment, the second direction is the X-axis positive direction, for example. With this configuration, all the power connectors 31, 32, and 33 and the signal connectors 41, 42, and 43 can be connected to connectors of other devices accessed from the direction opposite to the second direction, that is, a single direction. This allows easy connection and disconnection of the power connectors 31, 32, and 33 and the signal connectors 41, 42, and 43. As in the present embodiment, in the case of the electronic control unit 100 that is mounted on a vehicle, the mounting space is limited, and other devices are disposed around the electronic control unit 100. Therefore, the direction of access to the electronic control unit 100 is limited. As described above, the arrangement of connectors that allows connection and disconnection through the access from a single direction is particularly preferable.

In the electronic control unit 100 according to the present embodiment, the base 15 of the body housing 10 is made of a thermally conductive metal block, and is disposed adjacent to the heat generating part of the first circuit board 51. With this configuration, the base 15 serves as a heatsink to absorb heat of the heat generating part of the first circuit board 51 and dissipate the heat. This prevents overheating of the first circuit board 51, and hence prevents deterioration of the electronic parts on the first circuit board 51 and reduction in processing speed due to heat. Further, in the present embodiment, the base 15 is integral with the body housing 10.

Therefore, the heat absorbed by the base 15 is dissipated also via the body housing 10. Accordingly, the heat can be effectively dissipated.

The electronic control unit 100 according to the present embodiment further includes the first cover housing 21 and the second cover housing 22. The first cover housing 21 covers the first opening 11 exposing the electrical connection module 60. The second cover housing 22 covers the second opening 12 exposing the first circuit board 51. The opening 15*da* of the first positioning hole 15*d* of the base 15 faces the first opening 11. The opening 15*db* of the first positioning hole 15*d* faces the second opening 12. With this configuration, the electrical connection module 60 can be arranged and positioned on the base 15, from the outside of the body housing 10 through the first opening 11. Also, the first circuit board 51 can be arranged and positioned on the base 15, from the outside of the body housing 10 through the second opening 12. This facilitates mounting of the electrical connection module 60 and the first circuit board 51 to the body housing 10.

In the above, an electronic control unit according to one or more embodiments of the present invention has been described. However, the present invention is not limited thereto. Embodiments implemented by making various modifications conceived by a person skilled in the art to any of the embodiments described herein or embodiments configured by combining the elements of different embodiments without departing from the spirit of the present invention may also fall within the scope of the present invention.

In the electronic control unit 100 according to the present embodiment, a set of a first positioning hole 15*d* of the base 15, a second positioning hole 62*c* of the electrical connection module 60, and a third positioning hole 51*d* of the first circuit board 51 is provided. However, two or more sets may be provided. In the case where two or more sets of a first positioning hole 15*d*, a second positioning hole 62*c*, and a third positioning hole 51*d* are provided, the through-holes of each set are positioned by a positioning pin. Thus, the electrical connection module 60 and the first circuit board 51 can be positioned at predetermined positions with respect to the base 15, without the need to make a fine adjustment afterward.

In the electronic control unit 100 according to the present embodiment, the first positioning hole 15*d* of the base 15 is a continuous hole having a constant bore diameter. However, the present invention is not limited thereto. For example, the first positioning hole 15*d* may be a hole discontinuously extending between the opening 15*da* and the opening 15*db*. In this case, the first positioning hole 15*d* may include, for example, two holes, that is, a hole extending from the opening 15*da* and a hole extending from the opening 15*db*. Further, for example, the first positioning hole 15*d* does not need to have a constant bore diameter, and may have a varying bore diameter. In this case, for example, the bore diameter near the opening 15*da* and the bore diameter near the opening 15*db* may be different, and the bore diameter may be partially smaller between the opening 15*da* and the opening 15*db*. In this case, when the first positioning pin 91 and the second positioning pin 92 are inserted into the first positioning hole 15*d*, the first positioning pin 91 and the second positioning pin 92 engage with the inner surface of the first positioning hole 15*d*, and are prevented from being further inserted. This makes it easy to secure the required length by which the first positioning pin 91 and the second positioning pin 92 project from the first positioning hole 15*d*.

In the electronic control unit 100 according to the present embodiment, the housing 1 includes the body housing 10, the first cover housing 21, the second cover housing 22, and the third cover housing 23. However, the present invention is not limited thereto. For example, the number of cover housings does not need to be three. Further, although the body housing 10 is made of a single member, the body housing 10 may be made of a combination of two or more members. For example, the wall 14 and the base 15 may be separate members.

In the electronic control unit 100 according to the present embodiment, the first connector group 30 is connected to the harness of the power system of the vehicle, and the second connector group 40 is connected to the harness of the signal system of the vehicle. However, the present invention is not limited thereto, and the first connector group 30 and the second connector group 40 may be connected to any harness. For example, the first connector group 30 may be connected to the harness of the signal system, and the second connector group 40 may be connected the harness of the power system. The current flowing through the connector of the first connector group 30 and the current flowing through the connector of the second connector group 40 may be different or equal. Similar to the first connector group 30, the second connector group 40 may be connected to the circuit board 50 via a cable and an electrical connection module, or may be disposed outside the body housing 10 via a bracket or the like.

An electronic control unit according to the present invention is useful as an electronic control unit including a plurality of connectors.

The electronic control unit according to the present invention allows easy connection of a plurality of connectors, and has a simplified structure for positioning the components.

What is claimed is:

1. An electronic control unit that controls a rotary electric machine, the electronic control unit comprising:
    a housing including a wall defining an accommodation space, and a base extending from the wall into the accommodation space;
    a circuit board disposed on the base in the accommodation space;
    an electrical connection module disposed at a position different from the circuit board on the base in the accommodation space and electrically connected to the circuit board;
    a first connector group electrically connected to the electrical connection module; and
    a second connector group disposed on the wall and electrically connected to the circuit board, wherein:
    the first connector group and the second connector group are arranged in a first direction along the wall;
    the base, the electrical connection module, and the circuit board respectively have a first positioning hole, a second positioning hole, and a third positioning hole for positioning relative to each other;
    a first positioning pin is insertable into an opening of the first positioning hole through the second positioning hole; and
    a second positioning pin is insertable into another opening of the first positioning hole through the third positioning hole.

2. The electronic control unit according to claim 1, wherein:

the first connector group is disposed outside the housing and is connected to the electrical connection module via a cable extending from the first connector group; and the wall includes an electrically conductive first wall extending as a shield to separate the first connector group and the cable from the circuit board.

3. The electronic control unit according to claim 2, wherein:

the first connector group includes at least two connectors; each of the connector includes the cable; and the cables of the respective connectors have an equal length.

4. The electronic control unit according to claim 1, wherein:

the electrical connection module includes a first connecting member extending to the circuit board;

the second connector group includes a second connecting member extending to the circuit board; and the first connecting member and the second connecting member are connected to the circuit board, on opposite sides with respect to the base.

5. The electronic control unit according to claim 1, wherein:

the first connector group includes at least one first connector;

the second connector group includes at least one second connector;

the at least one first connector and the at least one second connector are arranged such that each of connecting parts of the at least one first connector and the at least one second connector faces a second direction crossing the first direction.

6. The electronic control unit according to claim 1, wherein the base is made of a thermally conductive metal block, and is disposed adjacent to a heat generating part of the circuit board.

7. The electronic control unit according to claim 1, further comprising:

a first cover housing that covers a first opening of the wall, the first opening exposing the electrical connection module; and a second cover housing that covers a second opening of the wall, the second opening exposing the circuit board, wherein:

an opening of the first positioning hole in which the first positioning pin is inserted faces the first opening; and an opening of the first positioning hole in which the second positioning pin is inserted faces the second opening.

* * * * *